US008392778B2

(12) United States Patent
Suzuki et al.

(10) Patent No.: US 8,392,778 B2
(45) Date of Patent: Mar. 5, 2013

(54) CLOCK DOMAIN CHECK METHOD, CLOCK DOMAIN CHECK PROGRAM, AND RECORDING MEDIUM

(75) Inventors: Keiichi Suzuki, Tokyo (JP); Susumu Abe, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/567,043

(22) Filed: Aug. 4, 2012

(65) Prior Publication Data

US 2012/0304033 A1 Nov. 29, 2012

Related U.S. Application Data

(62) Division of application No. 12/505,924, filed on Jul. 20, 2009, now Pat. No. 8,255,752.

(30) Foreign Application Priority Data

Aug. 20, 2008 (JP) ................................. 2008-211458

(51) Int. Cl.
*G01R 31/28* (2006.01)
*G06F 11/00* (2006.01)

(52) U.S. Cl. ...................................... 714/738; 714/742

(58) Field of Classification Search .................. 714/738, 714/742

See application file for complete search history.

(56) References Cited

U.S. PATENT DOCUMENTS

| 4,484,292 | A | * | 11/1984 | Hong et al. | 716/129 |
|---|---|---|---|---|---|
| 4,593,351 | A | * | 6/1986 | Hong et al. | 712/21 |
| 4,924,430 | A | * | 5/1990 | Zasio et al. | 716/108 |
| 5,049,814 | A | * | 9/1991 | Walker et al. | 714/736 |
| 5,177,440 | A | * | 1/1993 | Walker et al. | 714/736 |
| 5,636,372 | A | * | 6/1997 | Hathaway et al. | 713/500 |
| 5,649,176 | A | * | 7/1997 | Selvidge et al. | 713/400 |
| 5,831,996 | A | * | 11/1998 | Abramovici et al. | 714/738 |
| 5,867,541 | A |   | 2/1999 | Tanaka et al. | |
| 5,958,077 | A | * | 9/1999 | Banerjee et al. | 714/738 |
| 6,886,124 | B2 | * | 4/2005 | Wang | 714/738 |
| 7,398,494 | B2 | * | 7/2008 | Hoppe et al. | 716/106 |
| 7,526,696 | B2 | * | 4/2009 | Xiang et al. | 714/726 |
| 7,565,636 | B2 | * | 7/2009 | Hoppe et al. | 716/106 |

FOREIGN PATENT DOCUMENTS

| JP | 7-311735 A | 11/1995 |
|---|---|---|
| JP | 2004-030186 | 1/2004 |

* cited by examiner

*Primary Examiner* — Joseph D Torres
(74) *Attorney, Agent, or Firm* — Miles and Stockbridge P.C.

(57) ABSTRACT

To reduce pseudo errors.

A stationary signal is propagated through the circuit to be checked. A combination is extracted in which different asynchronous transfers occur between a transmitting side register and a receiving side register. From the extracted combination of asynchronous transfers, a circuit to be checked is extracted, and a synchronization circuit of a plurality of signals is excluded from the circuit to be checked. A stationary signal is propagated through the circuit to be checked, for each combination among all combinations of logic values "1" and "0" of the stationary signal. It is checked whether or not there exists one asynchronous transmitting side register to which signal change can logically reach, in the combination of logic values of the stationary signal propagated. Based on the result, it is determined whether or not the circuit is appropriate as a synchronization circuit for a single-signal transfer, thereby reducing pseudo errors.

2 Claims, 10 Drawing Sheets

$d = a\&c$
$e = b\&\sim c$
$f = d|e$

WHEN C = 1

WHEN C = 0

CLOCK DOMAIN CHECK METHOD, CLOCK DOMAIN CHECK PROGRAM, AND RECORDING MEDIUM

CROSS-REFERENCE TO RELATED APPLICATION

This application is a division of application Ser. No. 12/505,924 filed Jul. 12, 2009 now U.S. Pat. No. 8,255,752. Also, the disclosure of Japanese Patent Application No. 2008-211458 filed on Aug. 20, 2008 including the specification, drawings and abstract is incorporated herein by reference in its entirety.

BACKGROUND OF THE INVENTION

The present invention relates to CDC (clock-domain-crossing) technique which enables checking of synchronization circuits in asynchronous transfer of clocks.

In Soc (System on chip), there exist signals crossing an enormous number of clock domains on a single chip. If CDC (clock-domain-crossing) check is insufficient, an operation failure due to introducing a glitch (spike voltage at the time of switching input data) or an accident due to pass-through current may occur. Therefore, CDC check becomes important. In CDC check, a clock signal is propagated through the register based on information indicating a synchronous or asynchronous relationship of the clock signal to detect a register transfer point where the clocks have an asynchronous relationship, and it is checked whether or not the circuit related to the transfer is the desired synchronization circuit. An error analysis is then performed based on the check result.

Additionally, in an asynchronous transfer, the meta-stable state of a latch circuit which occurs due to an asynchronous input signal is regarded as a dangerous zone surrounded by the setup time and the hold time which are based on the rise or fall of the clock defined in the latch circuit. If the setup time or the hold time exceeds a certain period, the output signal becomes unstable. The state, being referred to as "meta-stable", causes malfunction of the system. In order to address the meta-stability, a circuit configuration is employed which is failure-free even if meta-stability occurs, (see, for example, patent document 1 (Japanese patent Laid-Open No. 7-311735)).

Furthermore, for a logic simulator taking into account the timing error that may occur in an asynchronous circuit, a technique is known which suppresses a large amount of pseudo errors occurring in timing check (see, for example, patent document 2 (Japanese Patent Laid-Open No. 2004-30186)). Here, with a terminal and a given time of a particular cell being specified in the timing error constraint specification information, the logic simulator overrides violation of the timing limitation tolerance value detected within a predefined time with regard to the terminal of the particular cell specified in the timing error constraint specification information so as not to output an error message.

According to the conventional CDC (clock-domain-crossing) check method, there may be a case in which as many as 1M errors are output when checking a Soc having, for example, about 10M gates. Reviewing such an enormous amount of errors, the inventor of the present application found that, in most cases there is no obstacle for asynchronous transfer in terms of chip specification, even if the circuit itself is violating circuit synchronism. If there is no obstacle for asynchronous transfer in terms of chip specification even if the circuit itself is violating circuit synchronism, such a case is referred to as a pseudo error. However, it is considered difficult to find real errors from the above-mentioned 1M errors, which requires a long time for error-analysis.

It is an object of the present invention to provide a technology which reduces pseudo errors.

The above and other objects as well as the new characteristics of the present invention will be clear from the descriptions and the attached drawings of the present specification.

SUMMARY OF THE INVENTION

A brief description of a representative embodiment among those disclosed in the present application is provided as follows.

That is, a stationary signal defined as a signal whose logic value does not change in an asynchronous transfer is propagated through the circuit to be checked. A combination is extracted in which different asynchronous transfers occur between a transmitting side register and a receiving side register. From the extracted combination of asynchronous transfers, a circuit to be checked is extracted by back-tracing for each of the receiving side registers toward the transmitting side and searching a transmitting side register, a circuit that leads to the transmitting side register, and a stationary signal, and a synchronization circuit of a plurality of signals is excluded from the circuit to be checked. A stationary signal is propagated through the circuit to be checked, for each combination among all combinations of logic values "1" and "0" of the stationary signal. In the combination of logic values of the stationary signal propagated, it is checked, based on the connection relation, whether or not there exists one asynchronous transmitting side register to which signal change can logically reach. It is determined from the check result whether or not the circuit configuration relating to asynchronous transfer is appropriate as a synchronization circuit for a single-signal transfer. Thus, pseudo errors can be reduced by determining whether or not the circuit configuration relating to asynchronous transfer is appropriate.

The effect obtained by a representative embodiment of the invention disclosed in this application will be briefly described below.

A technology which reduces pseudo errors can be provided.

DETAILED DESCRIPTION OF THE PREFERRED EMBODIMENTS

1. Representative Embodiment

Figure 1:
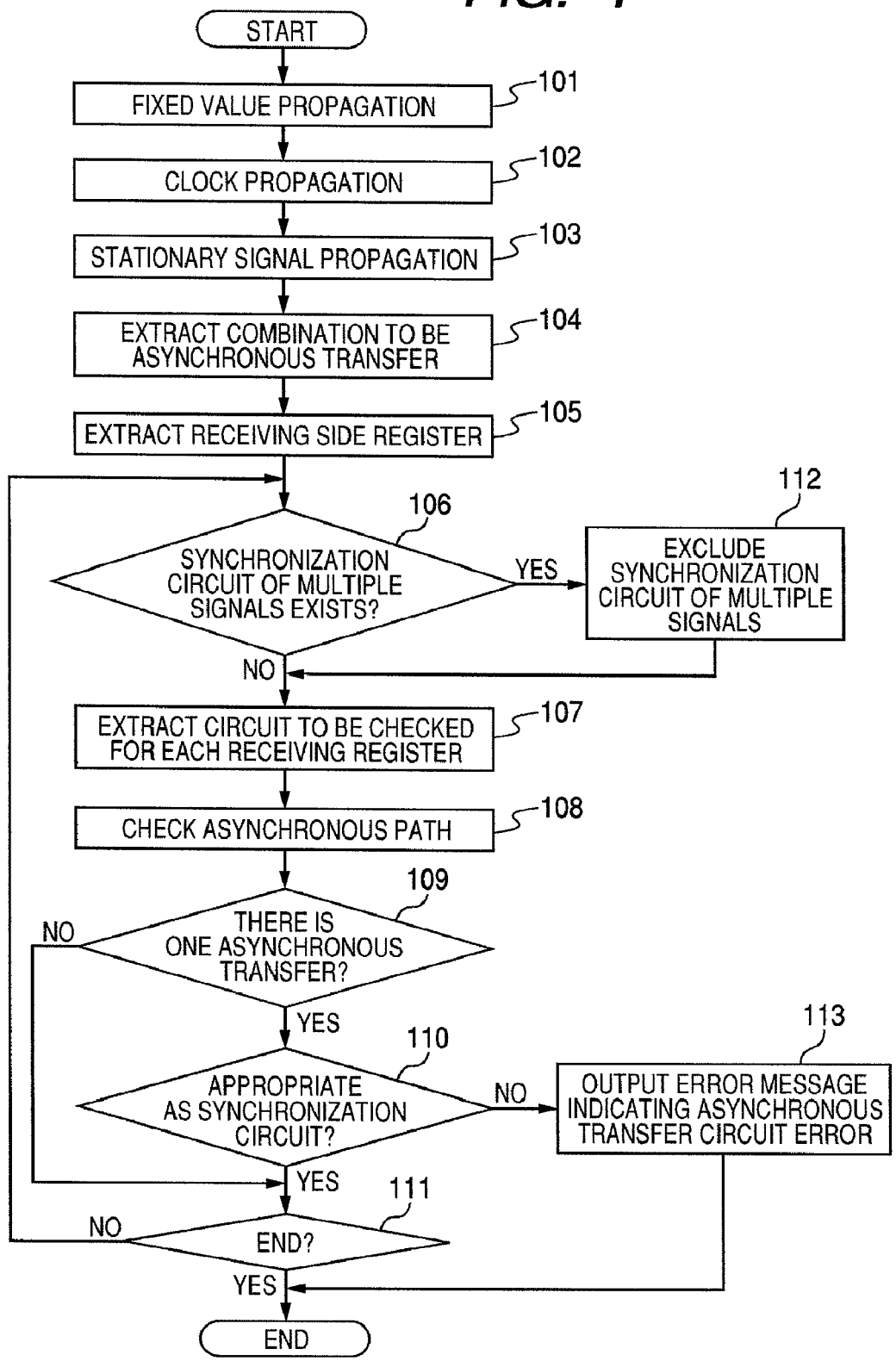
FIG. 1 is a flow chart illustrating an exemplary processing procedure when a clock domain check program according to the present invention is executed.

First, a representative embodiment of the invention disclosed in this application will be briefly described. Note that the reference numerals of the drawings, which are placed in parentheses and referred to in the brief description with regard to the representative embodiment, only indicate exemplary components included within the concept of the invention.

[1] In the clock domain check method according to a representative embodiment of the present invention, the first to sixth steps in the following are executed by a CPU (31).

Specifically, in the first step, a stationary signal defined as a signal whose logic value does not change in an asynchronous transfer is propagated through the circuit to be checked (103). In the second step, a combination is extracted in which different asynchronous transfers occur between a transmitting side register and a receiving side register (104). In the third step, a circuit to be checked is extracted from the combination of asynchronous transfers extracted in the second step by back-tracing for each of the receiving side registers toward the transmitting side and searching a transmitting side register, a circuit that leads to the transmitting side register, and a stationary signal, and a synchronization circuit of a plurality of signals is excluded from the circuit to be checked (106, 107, 112). In the fourth step, a stationary signal is propagated through the circuit to be checked, for each combination among all combinations of logic values "1" and "0" of the stationary signal (1062). In the fifth step, it is checked, from the connection relation whether or not there exists one asynchronous transmitting side register to which signal change can logically reach, in the combination of logic values of the stationary signal propagated in the fourth step (1064, 1965). In the sixth step, it is determined, based on the check result in the fifth step whether or not the circuit configuration relating to asynchronous transfer is appropriate as a synchronization circuit for a single-signal transfer (110). By determining whether or not the circuit configuration relating to the asynchronous transfer is appropriate, according to the above-mentioned arrangement, errors (pseudo errors) having no influence on chip operation are distinguished from real errors and thus become difficult to be detected even if circuit synchronism is violated, whereby reduction of pseudo errors can be achieved.

[2] Additionally, in place of the fourth step, it may be arranged such that the circuit to be checked which has been extracted in the third step is mapped to a binary decision diagram to which logic values "1" and "0" are subsequently provided, then the binary decision diagram is transformed to check, in place of the fifth step, from the remaining variables of the binary decision diagram whether or not there exists one asynchronous transmitting side register.

[3] In the paragraphs [1] and [2], the stationary signal is set to a fixed logic value of either "0" or "1" when other signals that perform asynchronous crossing change in asynchronous transfer, and the logic value does not change.

[4] From another point of view, a clock domain check program checks the synchronization circuit in asynchronous transfer by causing a computer to execute the following first to sixth procedures.

Specifically, in the first procedure, a stationary signal defined as a signal whose logic value does not change in an asynchronous transfer is propagated through the circuit to be checked (103). In the second procedure, a combination is extracted in which different asynchronous transfers occur between a transmitting side register and a receiving side register (104). In the third procedure, a circuit to be checked is extracted from the combination of asynchronous transfers extracted in the second procedure by back-tracing for each of the receiving side registers toward the transmitting side and searching a transmitting side register, a circuit that leads to the transmitting side register, and a stationary signal, and a synchronization circuit of a plurality of signals is excluded from the circuit to be checked (106, 107, 112). In the fourth procedure, a stationary signal is propagated through the circuit to be checked, for each combination among all combinations of logic values "1" and "0" of the stationary signal (1061, 1062). In the fifth procedure, it is checked from the connection relation whether or not there exists one asynchronous transmitting side register to which signal change can logically reach, in the combination of logic values of the stationary signal propagated in the fourth procedure (1064, 1965). In the sixth procedure, it is determined, based on the check result in the fifth procedure whether or not the circuit configuration relating to asynchronous transfer is appropriate as a synchronization circuit for a single-signal transfer (110).

[5] Additionally, in place of the fourth procedure, it may be arranged such that the circuit to be checked which has been extracted in the third procedure is mapped to a binary decision diagram to which logic values "1" and "0" are subsequently provided, then the binary decision diagram is transformed to check, in place of the fifth procedure, from the remaining variables of the binary decision diagram whether or not there exists one asynchronous transmitting side register.

[6] In the paragraphs [4] and [5], the stationary signal is set to a fixed logic value of either "0" or "1" when other signals that perform asynchronous crossing change in the asynchronous transfer, and the logic value does not change.

[7] The clock domain check program described in the paragraphs [4] to [6] can be recorded in a computer-readable recording medium.

Here, a D-type flip-flop circuit is included in the receiving or transmitting side registers.

2. Description of Embodiment

Next, an embodiment will be further described in detail.

Figure 3:
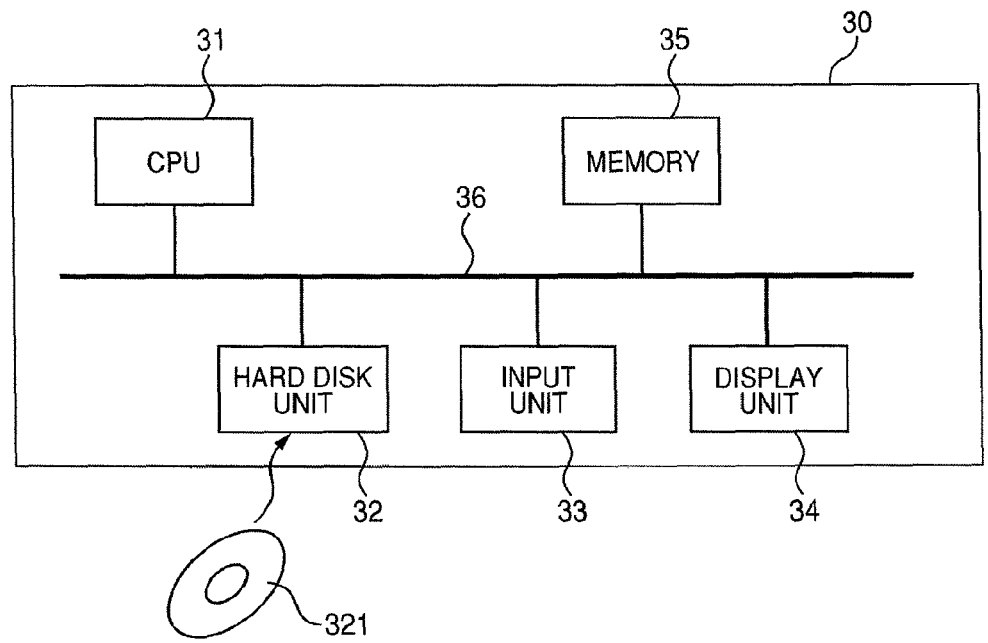
FIG. 3 is a block diagram illustrating an example of the overall arrangement of a computer system in which a clock domain check program is executed.

FIG. 3 illustrates an exemplary configuration of a computer system on which the clock domain check program according to the present invention is executed. A computer 30 shown in FIG. 1, which is not limited thereto in particular, comprises a CPU (Central Processing Unit) 31, a hard disk unit 32, an input unit 33, a display unit 34, and a memory 35, which are mutually coupled via a bus 36. The CPU 31 executes a predefined program. The CPU 31 in this example executes a clock domain check program which enables check of synchronization circuits in asynchronous transfer. The hard disk unit 32 has various information stored therein, such as various programs executed by the CPU 31 or a net list of circuits to be checked. Although not limited thereto in particular, a magnetic disk 321, which is a recording medium of the hard disk unit 32, is removable from the hard disk unit 32. With the magnetic disk 321 mounted on the hard disk unit 32, the computer 30 can read from or write into the magnetic disk 321.

The CPU 31 executes a predefined operation processing by reading the clock domain check program from the magnetic disk 321 on the hard disk unit 32. The memory 35 is used as a working area of the processing in the CPU 31. The memory 35 is, for example, a RAM (random access memory) which can be randomly accessed. The input unit 33, which allows a variety of information to be entered into the computer system, comprises a variety of input devices such as a keyboard or a mouse. The display unit 34, which displays a variety of information in the computer 30 as necessary, is a liquid crystal display, for example.

Figure 9:
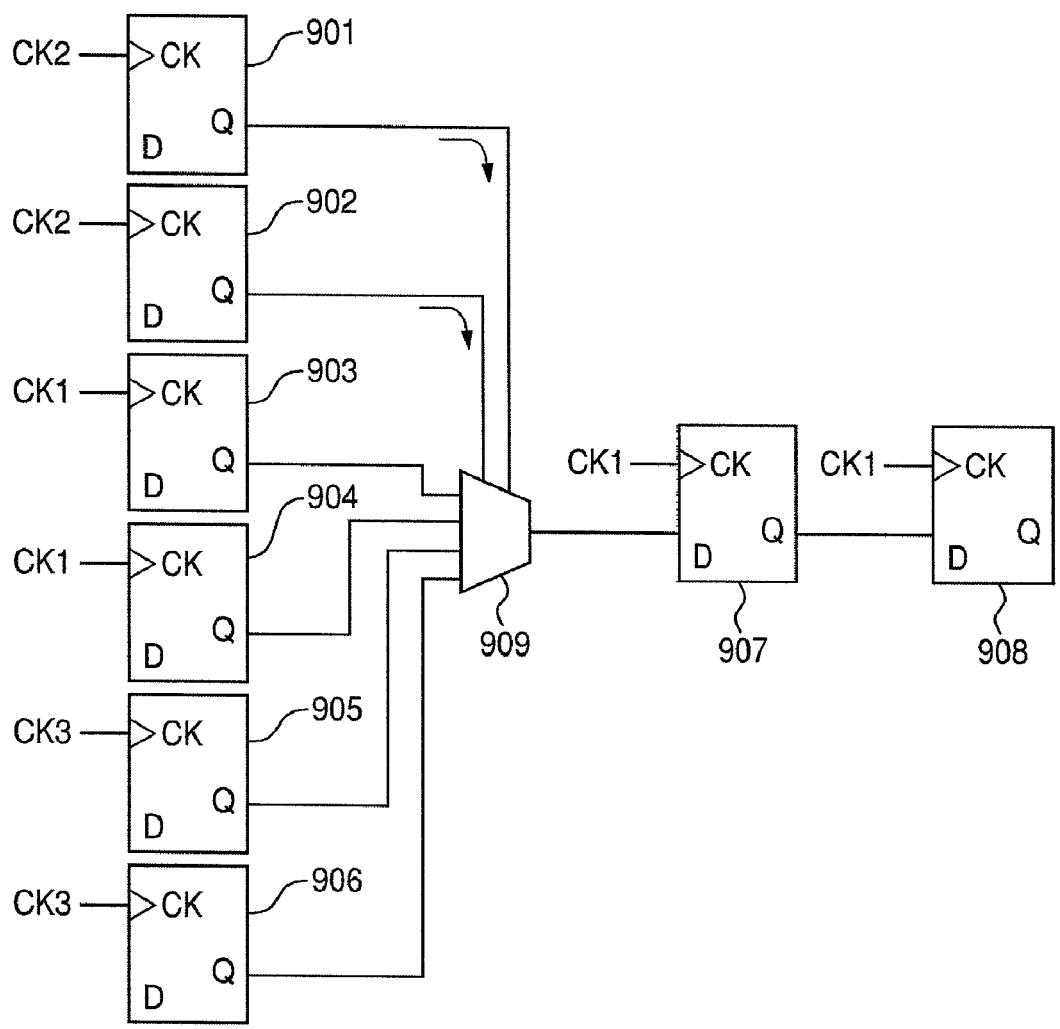
FIG. 9 is a block diagram illustrating the function of the stationary signal used in the clock domain check.
Figure 10:
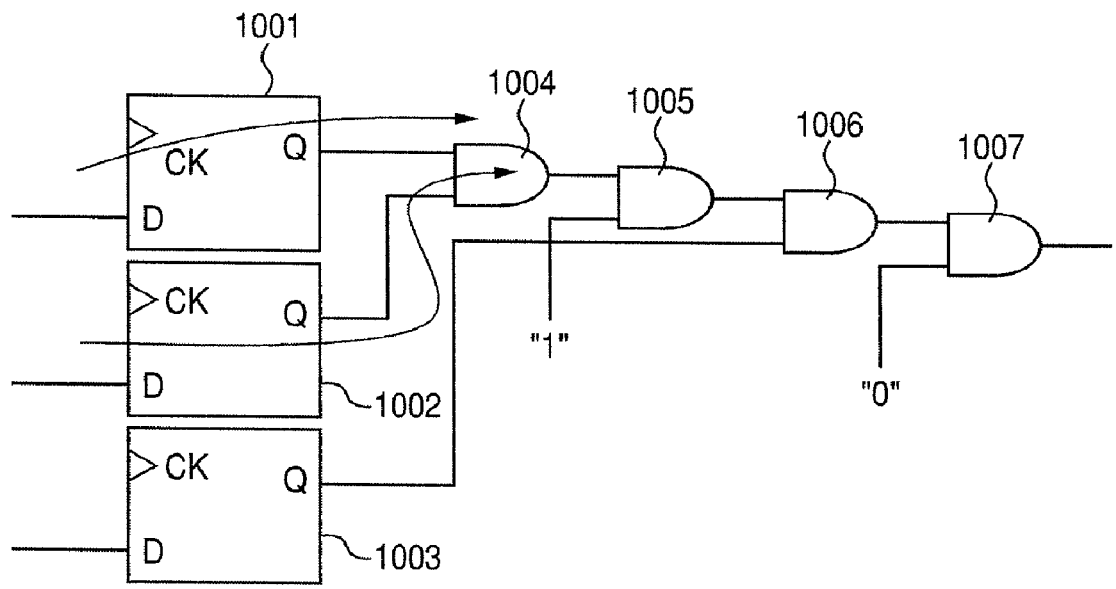
FIG. 10 is a block diagram illustrating the function of the stationary signal used in the clock domain check.

The stationary signal used for clock domain check performed by the computer 30 with the above-mentioned configuration will be described using FIGS. 8 to 10.

Figure 8:
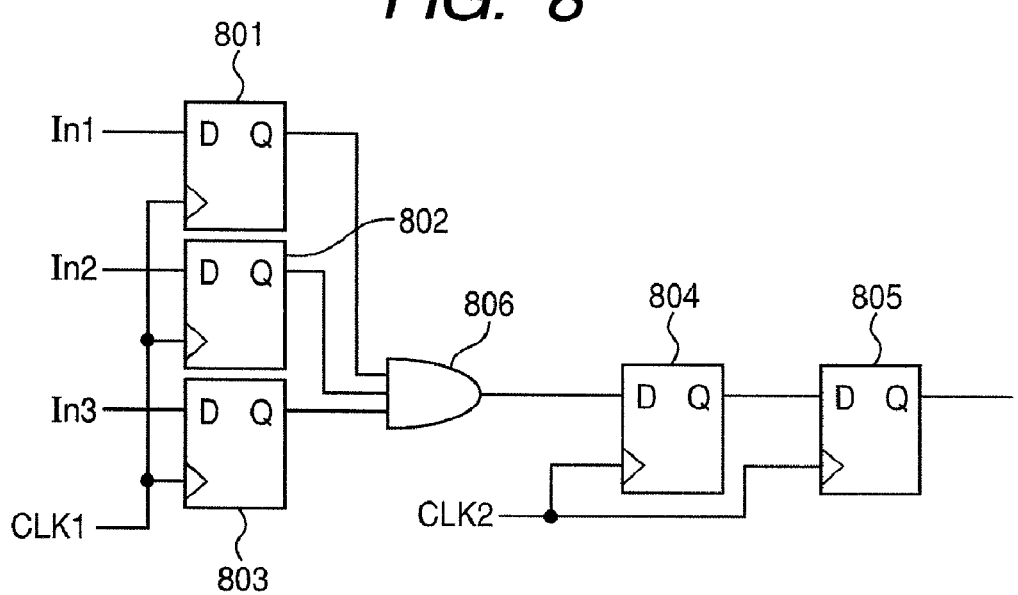
FIG. 8 is a block diagram illustrating the function of the stationary signal used in the clock domain check.

Let us consider, as the circuit to be checked, an asynchronous transfer circuit comprising, as shown in FIG. 8, D-type flip-flop circuits 801-805 and a 3-input AND gate 806. The flip-flop circuits 801-803 operate in synchronization with a first clock signal CLK1, whereas the flip-flop circuits 804 and 805 operate in synchronization with a second clock signal CLK2. The first clock signal CLK1 and the second clock signal CLK2 are in an asynchronous relationship to each other. When input signals In1, In2 and In3 randomly change, it is conceivable that the circuit shown in FIG. 8 may cause an error because a glitch at the AND gate 806 is introduced in the flip-flop circuit 804 as a correct state change. Here, if the input signal In1 is specified as a "stationary signal", the input signal In1 becomes an invariable signal with a fixed logic value of "0" or "1" although the other signals (i.e., In2 and In3) performing asynchronous crossing have variable logics. Specifically, it refers to a mode signal or a signal with the above-mentioned condition guaranteed by software flow (for example, 1 nl does not change simultaneously with In2 and In3) or the like. As a result, if two of the input signals In1, In2 and In3 are "stationary signals" the above-mentioned circuit becomes equivalent with a 1-bit signal crossing and therefore exhibits no obstacle as a synchronization circuit.

In addition, there is a case in which a stationary signal has a plurality of patterns of the logic combination, unlike a normal signal having a fixed logic. Let us consider a case in which an asynchronous transfer circuit including D-type flip-flop circuits 901-908 and a selection circuit 909 is formed as the circuit to be checked, as shown in FIG. 9 for example. The D-type flip-flop circuits 903, 904, 907 and 908 operate in synchronization with the first clock signal CK 1, the D-type flip-flop circuits 901 and 902 operate in synchronization with the second clock signal CK2, and the D-type flip-flop circuits 905 and 906 operate in synchronization with the third clock signal CK3. The selection circuit 909 transmits an output signal of one of the D-type flip-flop circuits 903-906 selectively to the D-type flip-flop circuit 907 of the subsequent stage, based on the output signals of the D-type flip-flop circuits 901 and 902. In such an arrangement, if the logic output value of the output terminal (Q) of the D-type flip-flop circuits 901 and 902 is fixed to "0,0" and an output signal of the output terminal (Q) of the D-type flip-flop circuit 906 is selected by the selection circuit 909, the asynchronous transfer check covers only the path from the D-type flip-flop circuit 906 to the D-type flip-flop circuit 907, and no asynchronous transfer check will be performed along the path from the D-type flip-flop circuit 905 to the D-type flip-flop circuit 907. Therefore, the output signal of the D-type flip-flop circuits 901 and 902 is treated as a "stationary signal" and four types of logic combinatorial patterns are set, namely "0,0", "0,1", "1,0" and "1,1". In this manner, output terminals (Q) of the D-type flip-flop circuits 903-906 are sequentially selected by the selection circuit 909 in the asynchronous transfer check of the circuit shown in FIG. 9 by switching four types of logic combinatorial patterns and, as a result, asynchronous transfer check can be performed along the paths from the D-type flip-flop circuits 903-906 to the D-type flip-flop circuit 907.

Furthermore, the stationary signal is propagated beyond the flip-flop circuit. Let us consider a case in which a synchronous transfer circuit including D-type flip-flop circuits 1001-1003 and 2-input AND gates 1004-1007 is formed as the circuit to be checked, as shown in FIG. 10 for example. The AND gate 1004 receives an AND logic of the output signal of the D-type flip-flop circuit 1001 and the output signal of the D-type flip-flop circuit 1002. The output signal of the AND gate 1004 is transmitted to one of the input terminals of the AND gate 1005 of the subsequent stage. The other input terminal of the AND gate 1005 is fixed to the logic value "1". The output signal of the AND gate 1005 is transmitted to one of the input terminals of the AND gate 1006 of the subsequent stage. The output signal of the D-type flip-flop circuit 1003 is transmitted to the other input terminal of the AND gate 1006. The output signal of the D-type flip-flop circuit 1006 is transmitted to one of the input terminals of the AND gate 1007 of the subsequent stage. The other input terminal of the D-type flip-flop circuit 1007 is fixed to the logic value "0". In such an arrangement, the logic of the output terminal of the AND gate 1005 is determined by specifying the signal of the data input terminal (D) of the D-type flip-flop circuits 1001 and 1002 as a stationary signal. In other words, if signals of the data input terminals (D) of the D-type flip-flop circuits 1001 and 1002 are specified as stationary signals, the stationary signals are propagated from the D-type flip-flop circuits 1001 and 1002 to the AND gate 1005 in the forward direction and, as a result, the input signal of the data input terminals (D) of the D-type flip-flop circuits 1001 and 1002, the output signal of the AND gate 1004, and the output signal of the AND gate 1005 have a property of a "stationary signal". The stationary signal is propagated in the forward direction (signal transmission direction) in a case of a through condition where the logic value of one of the input terminals is fixed as with the AND gate 1005, or a case in which all of the input signals are treated as a stationary signal as with the AND gate 1004, for example. Additionally, in FIG. 10, the stationary signal is propagated to the output terminal of the AND gate 1006 if the signal of the data input terminal (D) of the D-type flip-flop circuit 1003 is also treated as a stationary signal. Here, since the other input terminal of the AND gate 1007 is fixed to the logic value "0", the stationary signal will not be propagated to the output terminal of the AND gate 1007. Unlike a fixed signal, both logic values "1" and "0" are considered for the stationary signal.

FIG. 1 illustrates a processing procedure when executing the clock domain check program in the computer 30 having the above-mentioned configuration.

When execution of the clock domain check program is started in the computer 30, the net list, clock information, and a variety of stationary-signal-related information, referred to as exemplary information about the circuit to be checked, are read by the CPU 31 from the magnetic disk 321 on the hard disk unit 32. Here, the clock information includes information indicating the frequency of the clock signal, or synchronous/asynchronous relationship between a plurality of clock signals. In addition, a stationary signal is defined as a signal whose logic value does not change in an asynchronous transfer and any one of the net-name, signal name, and terminal name in the net list may be used to specify the stationary signal.

First, using the net list of the circuit, if a preliminarily fixed value (referred to as a fixed value) logically exists, the fixed value is provided and propagated in the circuit (101). Furthermore, a clock signal is fed to the circuit and propagated (102). Clock signals are distinguished between synchronous and asynchronous. The clock signal is propagated to the clock input terminal of the register (including D-type flip-flop circuits) and the clock name is stacked on the clock input terminal. If a plurality of clock signals arrives, a plurality of clock names is stacked in correspondence.

Next, the stationary signal is fed and propagated using the net list (103). In this occasion, the stationary signal is transmitted beyond the register (including D-type flip-flop circuits).

After the stationary signal is propagated in step 103, extraction of a combination in which asynchronous transfers occur is performed (104). In other words, a path search is performed in the forward direction (signal transmission direction) from the register (including D-type flip-flop circuits) and the input terminal, and a combination of asynchronous transfers is extracted.

Figure 11:
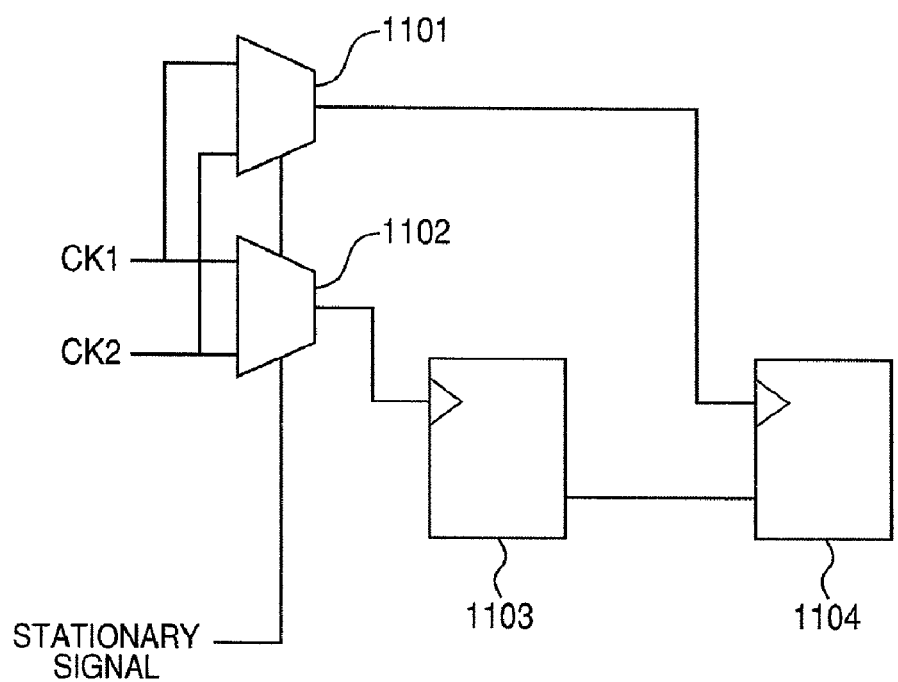
FIG. 11 is a block diagram illustrating the main operation when a clock domain check program is executed.

Here, a circuit which is no longer asynchronous due to propagation of the stationary signal is not extracted in step 104. For example, as shown in FIG. 11, selection by the selection circuits 1101 and 1102 is controlled by the stationary signal and accordingly, no extraction occur in step 104 because asynchronous transfer is not performed when synchronous transfer is performed between the D-type flip-flop circuits 1102 and 1104.

Then, all of the receiving side registers are extracted from the result of extracting a combination of asynchronous transfers obtained in step 104 (105). The following processing is performed for each of the receiving side registers.

Figure 4:
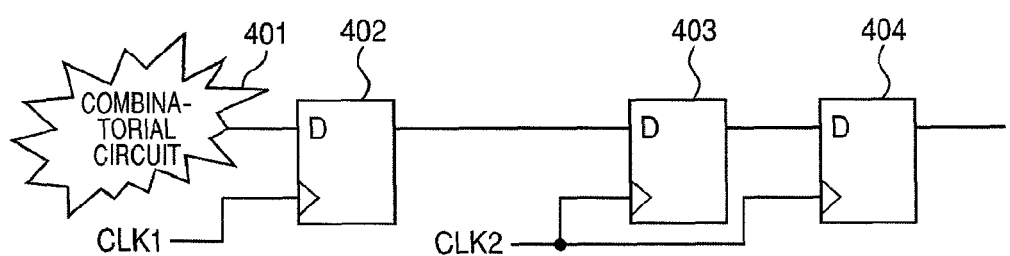
FIG. 4 is a block diagram illustrating an exemplary configuration of a synchronization circuit based on a single signal.
Figure 5:
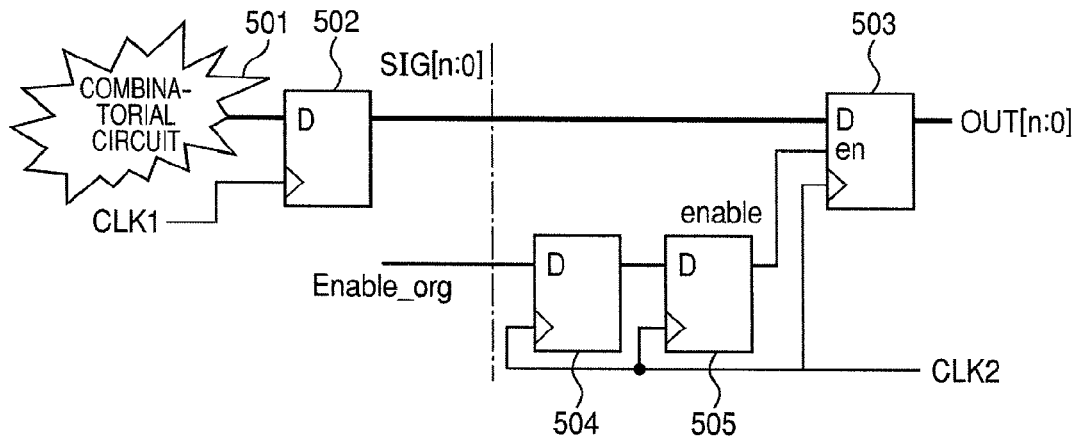
FIG. 5 is a block diagram illustrating an exemplary configuration of a synchronization circuit based on a plurality of signals.
Figure 6:
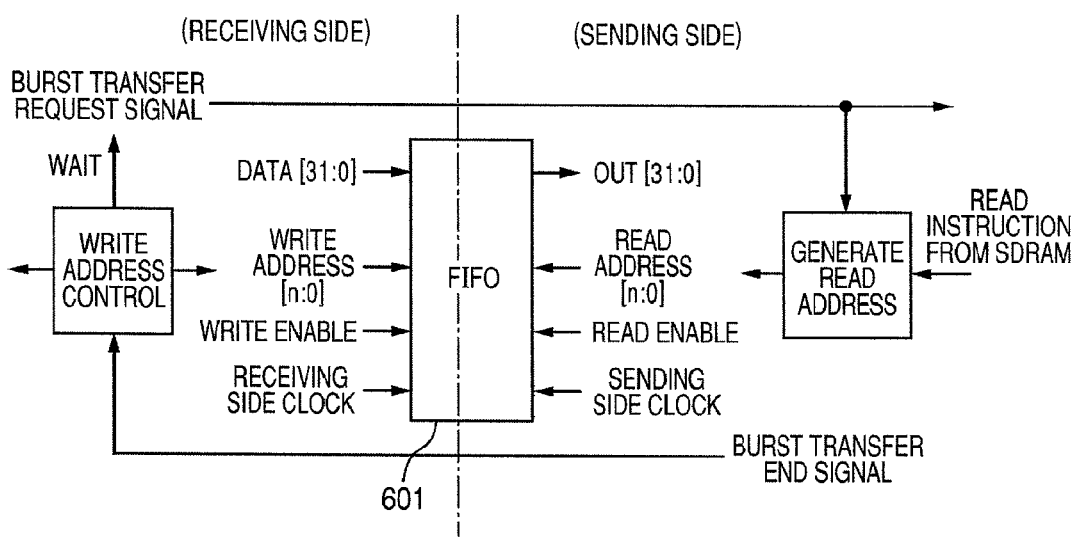
FIG. 6 is a block diagram illustrating an exemplary configuration of the synchronization circuit based on a plurality of signals.
Figure 7:
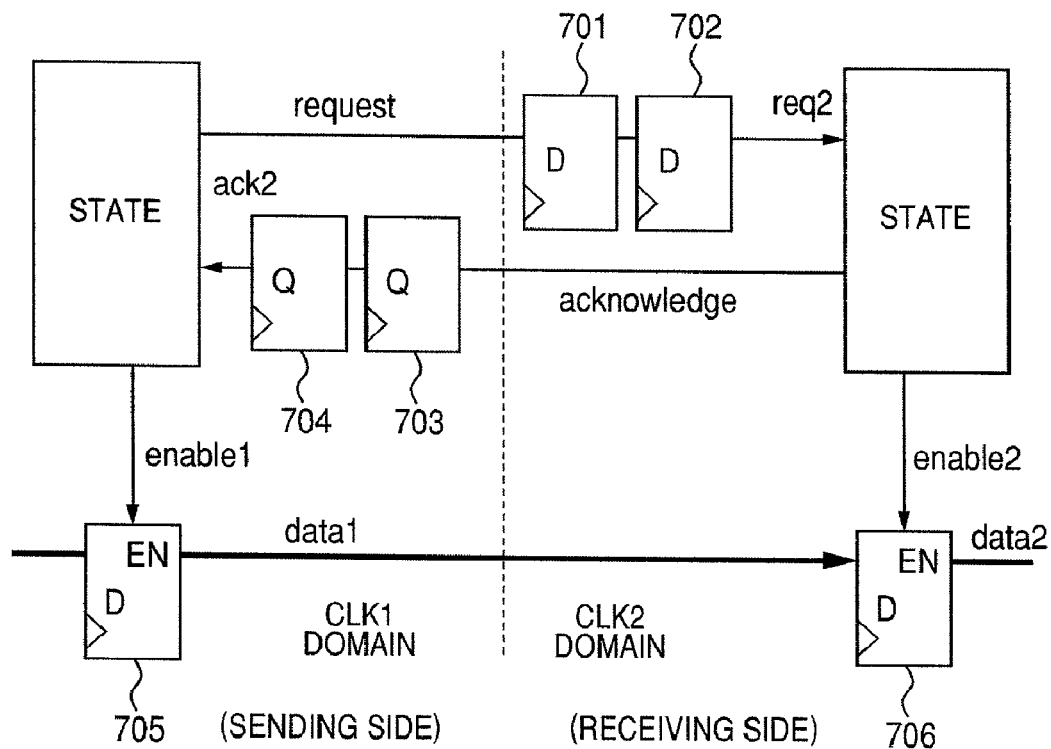
FIG. 7 is a block diagram illustrating an exemplary configuration of the synchronization circuit based on a plurality of signals.

After receiving side registers have been extracted in step 105, it is determined, for each of the receiving side registers, whether or not a synchronization circuit of a plurality of signals exists (106). FIGS. 5, 6 and 7 illustrate an exemplary synchronization circuit of a plurality of signals. For example, as shown in FIG. 5, when an asynchronous transfer circuit is formed including a D-type flip-flop circuit 502 disposed at the subsequent stage of a combinatorial circuit 501, a D-type flip-flop circuit 503 disposed at the subsequent stage thereof, and D-type flip-flop circuits 54 and 505 which feed an enable signal to the D-type flip-flop circuit 503, a data SIG [n: 0] which is output from the D-type flip-flop circuit 502 is synchronized, as well as an enable signal "enable", by a clock signal CLK2 in the D-type flip-flop circuit 503. The enable signal "enable" has a meta-stable measure applied thereon, with the original enable signal Enable_org being synchronized by an identical clock signal in the 2-stage arrangement of the D-type flip-flop circuits 504 and 505. Additionally, as shown in FIG. 6, there is a case in which data transfer is performed with a FIFO (First-In-First-Out) buffer 601 intervening between the transmitting and receiving sides. If the clock signal of the synchronization side (receiving side) has a frequency three times or less of the clock signal of the transmitting side, the frequency ratio of the synchronization signal can be increased three times or more by buffering it in the FIFO buffer 601 and using a flag corresponding to buffer-full condition (corresponding to a burst transfer request signal or a burst transfer end signal). There is case in which a synchronous transfer circuit is arranged in this manner to determine whether or not there is an error in the coupling of synchronization circuits. Furthermore, there is a case in which handshake of Request and Acknowledge is performed between the transmitting and receiving sides (the side to be synchronized). For example, as shown in FIG. 7, the transmitting side is synchronized with a first clock signal CLK1, whereas the receiving side is synchronized with a second clock signal CLK2. A request is submitted from the transmitting side to the receiving side, whereas an acknowledge is returned from the receiving side to the transmitting side. The request signals from the transmitting side to the receiving side have a meta-stable measure applied thereto by the 2-stage arrangement of the D-type flip-flop circuits 701 and 702. The acknowledge signals from the receiving side to the transmitting side have a meta-stable measure applied thereto by the 2-stage arrangement of the D-type flip-flop circuits 703 and 704. Data transfer from the transmitting side to the receiving side is performed by acknowledge to the request. In comparison to the synchronization circuit of a plurality of signals, a synchronization circuit for a single-signal is referred to as a single-signal synchronization circuit, as shown in FIG. 4. In other words, when an asynchronous transfer circuit is formed including a D-type flip-flop circuit 402 disposed at the subsequent stage of the combinatorial circuit 401, and D-type flip-flop circuits 403 and 404 disposed at the subsequent stage thereof, the glitch is eliminated in the D-type flip-flop circuit 402 of the transmitting side, and a meta-stable measure is applied thereto by the 2-stage arrangement of the D-type flip-flop circuits 403 and 404 on the receiving side.

If it has been determined that there exists a synchronization circuit of a plurality of signals (Y) in the determination of step 106, the synchronization circuit of a plurality of signals is excluded from the circuit to be checked (112). Then, if it is determined that a synchronization circuit of a plurality of signals does not exist (N) in step 106, or after the synchronization circuit of a plurality of signals is excluded from the circuit to be checked in step 112, extraction of a circuit to be checked is performed for each of the receiving side registers (107). In other words, a circuit to be checked is extracted from the combination of asynchronous transfers extracted in step 104 by back-tracing for each of the receiving side registers toward the transmitting side and searching a transmitting side register, a path to the transmitting side register, and a stationary signal.

Next, an asynchronous path check is performed (108). The asynchronous path check will be described below in detail referring to FIG. 2.

Based on the result of the asynchronous path check in step 108, it is determined whether or not there exists one asynchronous transfer (109). If it has been determined in step 109 that there exists one asynchronous transfer, it is determined whether or not the circuit to be checked is appropriate as a synchronization circuit (110). If, for example, a meta-stable measure is applied, it is determined that the circuit is appropriate as a synchronization circuit, whereas it is determined as inappropriate if a meta-stable measure is not applied. If it has been determined in step 110 to be appropriate as a synchronization circuit (Y), it is determined whether or not to terminate the processing according to the flow chart (111). If the processing of steps 106-110 has not been completed for all of the receiving side registers extracted in step 105, the flow returns to the determination in step 106 and executes the processing of steps 106-110 for another receiving side register. If the processing of steps 106-110 has been completed for all of the receiving side registers extracted in step 105, the processing according to the flow chart is terminated in step 111. Additionally, if it has been determined in step 110 to be inappropriate as a synchronization circuit (N), the processing according to the flow chart is terminated after an error message indicating asynchronous transfer circuit failure is output (113).

Next, an asynchronous path check of step 108 will be described in detail.

First, the FLAG is set to the logic value "0" (1060). Next, the number of stationary signals in the circuit to be checked is set to be "N", then a combination of all of the stationary signals which are set to the logic values "0" and "1", i.e., a combination of logics of the N-th power of 2 is generated (1061). For example, if the number (N) of stationary signals in the circuit to be checked is two, combinatorial patterns of "0,0" "0,1" "1,0" and "1,1" are generated in step 1061.

Next, a stationary signal is propagated for each combination of the logic values generated in step 1061 (1062). In other words, if there exists a plurality of stationary signals in the circuit to be checked, they are propagated in the circuit to be checked for each of the combinatorial patterns of the stationary signals to perform a simulation.

Figure 2:
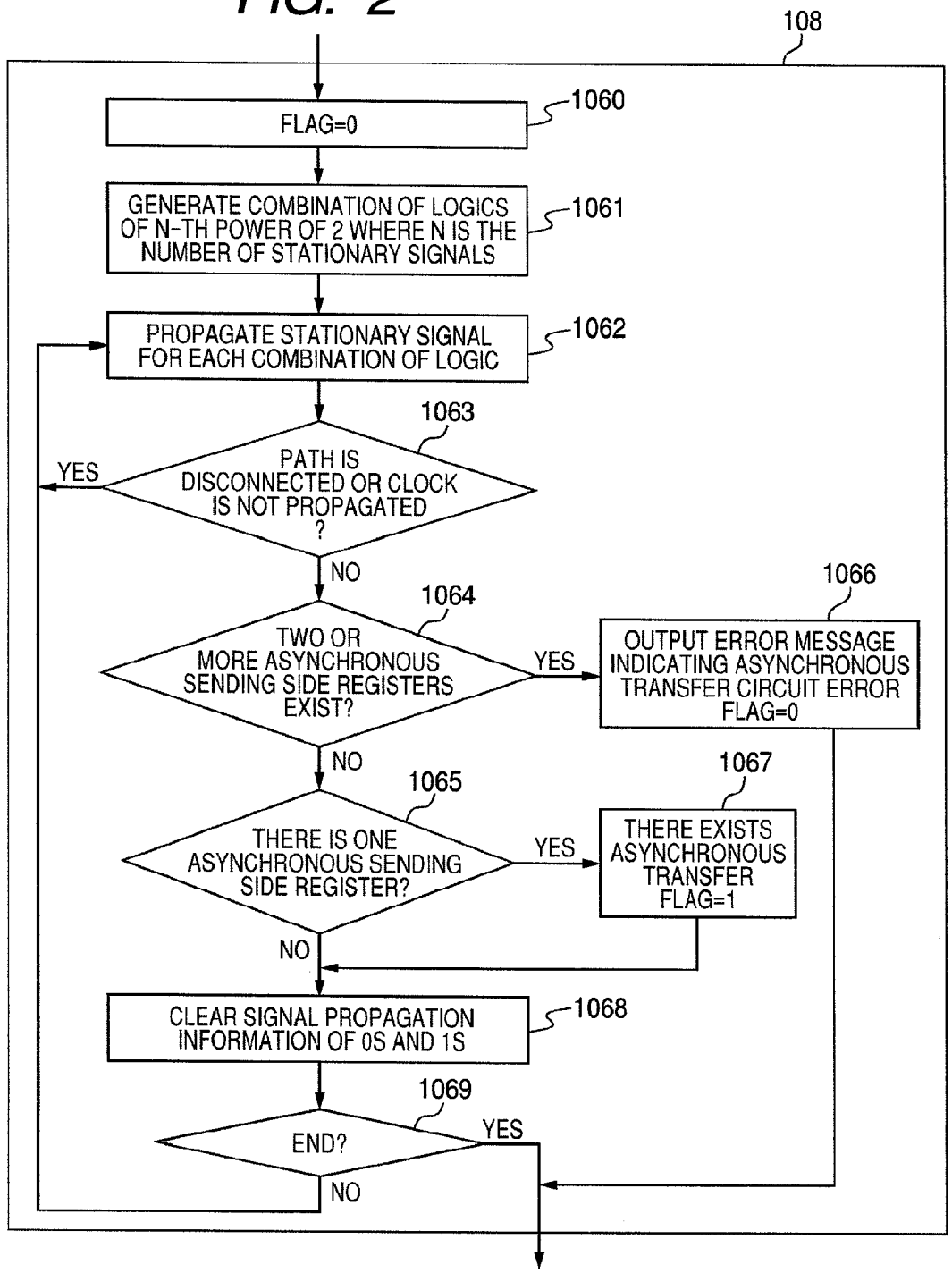
FIG. 2 is a flow chart illustrating a detailed flow of an asynchronous path check in FIG. 1.

Then, based on the result of propagating the stationary signal in step 1062 in FIG. 2, it is determined whether or not there exists a place where the path of signal transmission is broken, or the clock signal cannot be propagated (1063). If it has been determined that there is not a place where the path of signal transmission is broken or the clock signal cannot be propagated (N), a determination is performed as to whether or not there exist two or more asynchronous transmitting side registers in one circuit (1064). If it has been determined that there are not two or more asynchronous transmitting side registers in a circuit (N), a determination is performed as to whether or not there exists a asynchronous transmitting side register (1065). If it has been determined that there exists no asynchronous transmitting side registers (N), signal propagation information of the logic values "0" and "1" in the circuit to be checked is cleared (1068). Then it is determined whether or not to terminate the asynchronous path check (1069). In other words, if the processing of steps 1062 to 1068 has not been completed for all of the combinations of the logic values "0" and "1" generated in step 1061, the process flow moves to step 1062 where the processing of steps 1062 to 1068 is performed on another combinatorial pattern of the logic values "0" and "1". If, otherwise, the processing of steps 1062 to 1068 has been completed for all of the combinations of the logic values "0" and "1" generated in step 1061, the asynchronous path check in step 108 is terminated and the process flow moves to the determination in step 109 (FIG. 1). If it has been determined in step 1064 that there exist two or more asynchronous transmitting side registers in one circuit (Y), an error message indicating asynchronous transfer circuit failure is output, the FLAG is set to the logic value "0" (1066), and the asynchronous path check in step 108 is terminated. In addition, if it has been determined in step 1065 that there exists one asynchronous transmitting side register (Y), it indicates that there exists one asynchronous transfer, in other words, there exists one circuit in which the input and output seem to be logically coupled on a one to one basis, therefore the process flow moves to the processing of step 1068 after setting the FLAG to the logic value "1". In the determination in step 109 (FIG. 1), it is determined whether or not there exists one asynchronous transfer according to the logic value of the FLAG.

In the following, a case will be described in which it has been determined in step 1065 that there exists one asynchronous transmitting side register (Y), in other words, the input and output seem to be logically coupled on a one to one basis.

Figure 12:
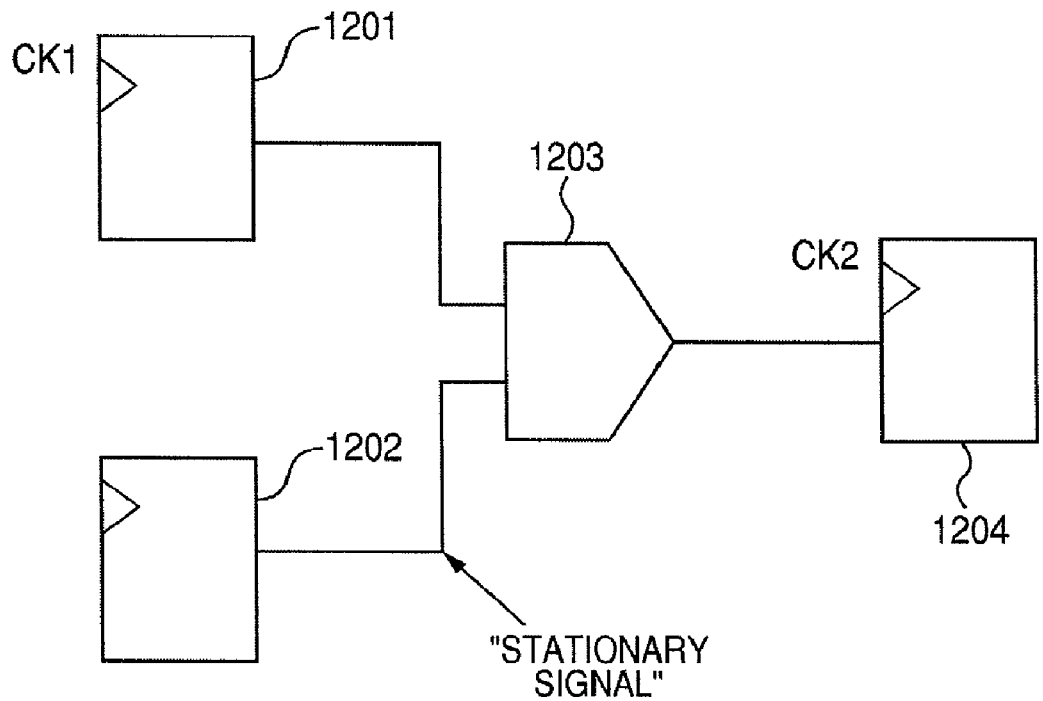
FIG. 12 is a block diagram illustrating the main operation when a clock domain check program is executed.
Figure 13:
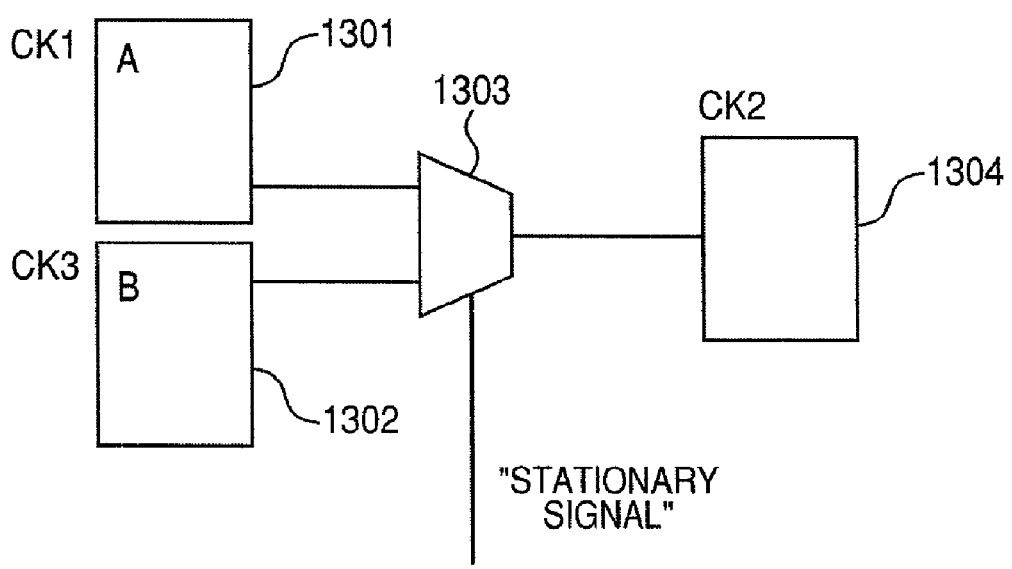
FIG. 13 is a block diagram illustrating the main operation when a clock domain check program is executed.

For example, as shown in FIG. 12, in the case where the circuit to be checked is arranged such that the asynchronous transfer circuit comprises D-type flip-flop circuits 1201, 1202 and 1204, and an AND gate 1203, with the output signal of the D-type flip-flop circuit 1202 being treated as the stationary signal, it is determined that the D-type flip-flop circuits 1201 and 1204 are coupled on a one to one basis if the logic value of the stationary signal is "1". In addition, as shown in FIG. 13, in the case where the circuit to be checked is arranged such that the asynchronous transfer circuit comprises the D-type flip-flop circuits 1301, 1302 and 1304, and the selection circuit 1303, with the signal controlling the selection operation of the selection circuit 1303 being treated as the stationary signal, it is determined that the D-type flip-flop circuits 1301 and 1304 are coupled on a one to one basis if the logic value of the stationary signal is "0", and it is determined that the D-type flip-flop circuits 1302 and 1304 are coupled on a one to one basis if the logic value of the stationary signal is "1".

According to the above-mentioned examples, the following effect can be obtained.

(1) The clock domain check program is read from the magnetic disk 321 on the hard disk unit 32 and executed by the CPU 31, whereby the processing of the flow chart shown in FIGS. 1 and 2 is performed. In the processing, errors (pseudo errors) which do not have an influence on the chip operation are actually detected in a distinguished manner from real errors via a stationary signal having a logic value "0" or "1", whereby detection of real errors are suppressed even if circuit synchronism is violated. Therefore, information of pseudo errors can be significantly reduced. According to the clock domain check actually performed by the inventor of the present invention, pseudo errors can be reduced to approximately five hundredth compared to prior-art, depending on the configuration of the circuit to be checked.

(2) Owing to the effect of paragraph (1), error analysis time is significantly reduced, whereby the cost of chip production can be reduced.

Although the invention conceived by the inventor has been described concretely, it is needless to say that the present invention is not limited to the foregoing and various modifications can be made without deviating from its scope.

Figure 14B:
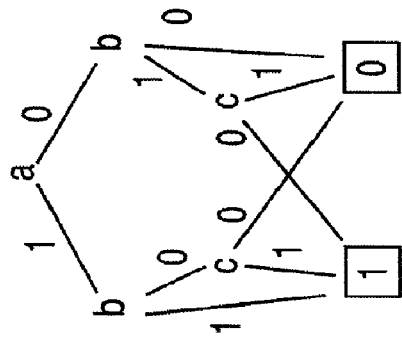
FIG. 14 is a block diagram illustrating the processing procedure when a clock domain check program according to the present invention is executed.
Figure 14A:
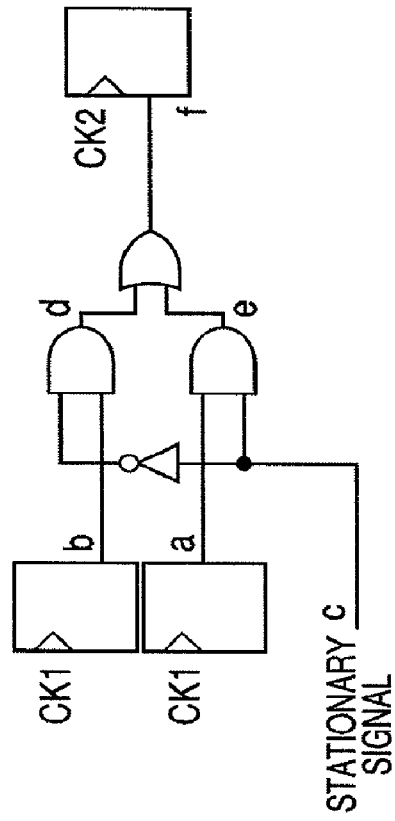
Figure 15A:
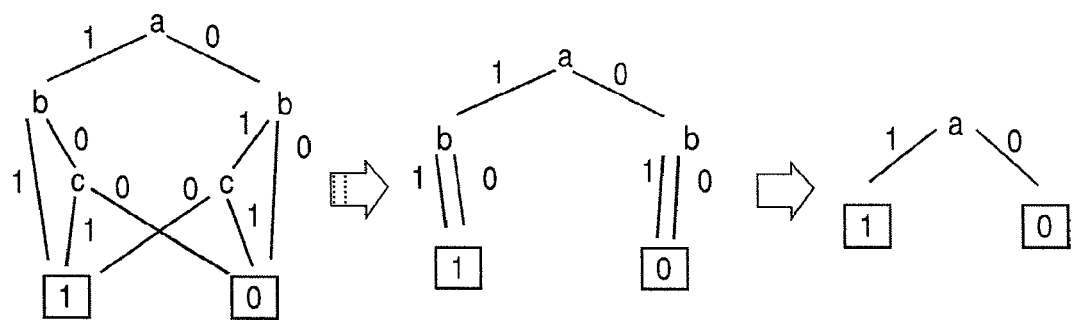
FIG. 15 is a block diagram illustrating the processing procedure when a clock domain check program according to the present invention is executed.
Figure 15B:
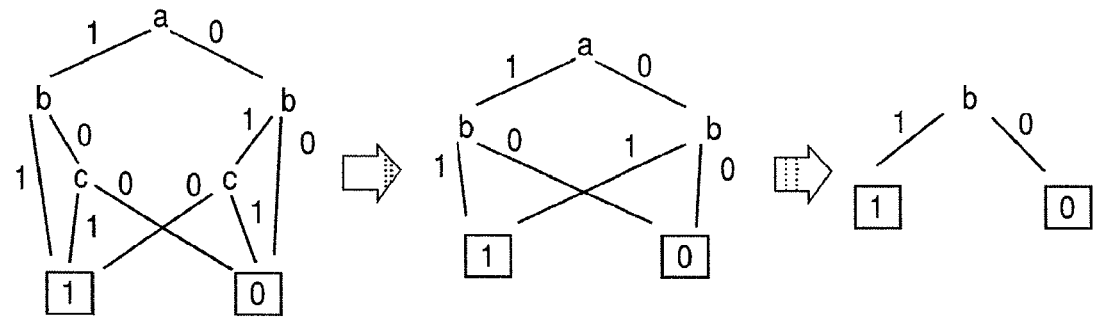

For example, although the asynchronous path check is performed in the above example by simulation as shown in FIG. 2, a binary decision diagram can be used in place of the simulation for each of the receiving side registers. In other words, steps of mapping the circuit to be checked which has been extracted in step 107 to a binary decision diagram, providing the binary decision diagram with logic values "1" and "0", and transforming the binary decision diagram are provided as well as a step of checking, from the remaining variables of the binary decision diagram, whether or not there exists one asynchronous transmitting side register. Then the determination in step 110 is performed based on the result of checking whether or not there exists one asynchronous transmitting side register. For example, the circuit to be checked shown in FIG. 14 (A) (basically equivalent with that shown in FIG. 13, and asynchronous with clock signals CK1 and CK2) is mapped to a binary decision diagram shown in FIG. 14 (B), then the binary decision diagram is transformed. Here, if the stationary signal C has the logic value "1", the binary decision diagram is transformed by excluding the path having the stationary signal C of the logic value "0" from the paths with the logic values "1" and "0", as shown in FIG. 15 (A), whereby the asynchronous node "a" remaining in the binary decision diagram is detected. If, on the other hand, the stationary signal C has the logic value "0", the binary decision diagram is transformed by excluding the path having the stationary signal C of the logic value "1" from the paths with the logic values "1" and "0", as shown in FIG. 15 (B), whereby the asynchronous node "b" remaining in the binary decision diagram is detected. In this manner, the binary decision diagram is transformed, and it is checked from the remaining variables of the binary decision diagram whether or not there exists one asynchronous transmitting side register. In this manner, a similar effect can also be obtained as with the above-mentioned simulation.

Additionally, as with the case of the above-mentioned clock domain check, pseudo errors in timing check can be reduced by limiting the paths in the timing check by setting a stationary signal in the circuit which is the target of the timing check.

The above-mentioned magnetic disk 321 is an exemplary recording medium which can be read by the computer 30. Other than the above-mentioned magnetic disk 321, an optical disk on an optical disk unit or a semiconductor storage device such as a flash memory can be applied as a recording medium which can be read by the computer 30.

What is claimed is:

1. A clock domain check method which performs a clock domain check in a circuit to be checked using a central processing unit, the method comprising:
   a first step of allowing a stationary signal defined as a signal whose logic value does not change in an asynchronous transfer to propagate through the circuit to be checked;
   a second step of extracting a combination in which different asynchronous transfers occur between a transmitting side register and a receiving side register;
   a third step of extracting a circuit to be checked from the combination of asynchronous transfers extracted in the second step by back-tracing for each of the receiving side registers toward the transmitting side and searching the transmitting side register, a circuit that leads to the transmitting side register, and a stationary signal, and excluding a synchronization circuit of a plurality of signals from the circuit to be checked;
   a fourth step of mapping the circuit to be checked which has been extracted in the third step to a binary decision diagram, providing logic values "1" and "0" to the binary decision diagram, and transforming the binary decision diagram;
   a fifth step of checking, from the remaining variables of the binary decision diagram, whether or not there exists one asynchronous transmitting side register; and
   a sixth step of determining, based on the check result in the fifth step, whether or not the circuit configuration relating to asynchronous transfer is appropriate as a synchronization circuit for a single-signal transfer,
   wherein the first to sixth steps are executed by the central processing unit.

2. The clock domain check method according to claim 1, wherein the stationary signal is set to a fixed logic value of either "0" or "1" and the logic value does not change when other signals that perform asynchronous crossing in the asynchronous transfer.

* * * * *